(12) United States Patent
Cao et al.

(10) Patent No.: US 10,632,630 B2
(45) Date of Patent: Apr. 28, 2020

(54) ROBOT JOINT AND ROBOT INCLUDING THE SAME

(71) Applicant: ABB Schweiz AG, Baden (CH)

(72) Inventors: Kaiyuan Cao, Shanghai (CN); Xiaodong Cao, Shanghai (CN); Yun Ha, Shanghai (CN); Zhu Zhu, Shanghai (CN); Jiajie Sha, Shanghai (CN)

(73) Assignee: ABB Schweiz AG, Baden (CH)

( * ) Notice: Subject to any disclaimer, the term of this patent is extended or adjusted under 35 U.S.C. 154(b) by 220 days.

(21) Appl. No.: 15/943,231

(22) Filed: Apr. 2, 2018

(65) Prior Publication Data

US 2018/0222063 A1 Aug. 9, 2018

Related U.S. Application Data

(63) Continuation of application No. PCT/CN2015/096088, filed on Dec. 1, 2015.

(51) Int. Cl.
*B25J 19/00* (2006.01)
*H01R 35/02* (2006.01)
(Continued)

(52) U.S. Cl.
CPC .......... *B25J 19/0025* (2013.01); *B25J 17/00* (2013.01); *B25J 17/02* (2013.01); *B25J 19/0029* (2013.01);
(Continued)

(58) Field of Classification Search
CPC .... B25J 19/0025; B25J 17/00; B25J 19/0029; B25J 17/02; H01R 35/025; H05K 1/0393; Y10T 74/20311
See application file for complete search history.

(56) References Cited

U.S. PATENT DOCUMENTS 4,978,191 A * 12/1990 Hasegawa ............. B60R 16/027
188/2 R
5,384,431 A 1/1995 Tusques
(Continued)

FOREIGN PATENT DOCUMENTS

EP 0556779 A1 8/1993
JP H07156093 A 6/1995
(Continued)

OTHER PUBLICATIONS

European Patent Office, Extended European Search Report in corresponding application No. 15909484.6, dated Sep. 11, 2019, 8 pp.

(Continued)

*Primary Examiner* — Jeremy R Severson
(74) *Attorney, Agent, or Firm* — Taft Stettinius & Hollister LLP; J. Bruce Schelkopf (57) ABSTRACT

A robot joint and a robot using the robot joint is provided. The robot joint includes a first part and a second part configured to be rotatable with each other around a joint axis. A flexible printed circuit board is further included with a first fixing point and a second fixing point respectively fastened to the first part and the second part. The flexible printed circuit board is spiral-shaped prior to bending. With the relative rotation of the first part and the second part, the flexible printed circuit board is bent at various bending portions. This makes the robot joint more compact with a larger rotation range and a long lifetime in a cost effective way.

20 Claims, 7 Drawing Sheets

(51) Int. Cl.
*B25J 17/00* (2006.01)
*B25J 17/02* (2006.01)
*H05K 1/03* (2006.01)

(52) U.S. Cl.
CPC ......... *H01R 35/025* (2013.01); *H05K 1/0393* (2013.01); *Y10T 74/20311* (2015.01)

(56) References Cited

U.S. PATENT DOCUMENTS

| | | | |
|---|---|---|---|
| 9,815,211 B2* | 11/2017 | Cao | B25J 19/0029 |
| 2014/0316571 A1* | 10/2014 | Tsai | B25J 13/088 |
| | | | 700/258 |

FOREIGN PATENT DOCUMENTS

| | | |
|---|---|---|
| JP | H09123083 A | 5/1997 |
| WO | 2014201606 A1 | 12/2014 |
| WO | 2015077953 A1 | 6/2015 |

OTHER PUBLICATIONS

State Intellectual Property Office of the P.R. China International Search Report & Written Opinion issued in corresponding Application No. PCT/CN2015/096088, dated Sep. 7, 2016, 9 pp.

* cited by examiner

ROBOT JOINT AND ROBOT INCLUDING THE SAME

TECHNICAL FIELD

The present invention relates to a robot joint, and more particularly, to a rotary joint of robot which includes a flexible printed circuit board and a robot including the same.

BACKGROUND ART

For industrial robots, especially the ones designed to work in limited and complex workspaces, flexibility and compactness are two major design requirements. Generally, the larger the rotation ranges of robot joints are, the more flexible the robot is. Usually, cables and hoses are routed within the robot joints to prevent interfering with surroundings. But these cables cannot bear too much bending and twisting for a long time. In addition, improper routing structures may cause cables and hoses bending in small radius, twisting in small length, or sliding on coarse surfaces, all of which will reduce the lifetime of cables and lead to unexpected shutdown.

Figure 1A:
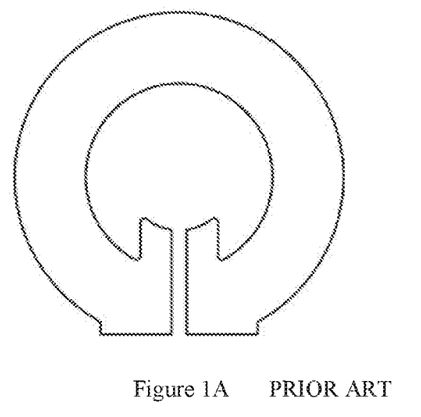
FIG. 1A illustrates an expanded view of a conventional flexible printed circuit (FPC) board in a shape of a broken ring.
Figure 1B:
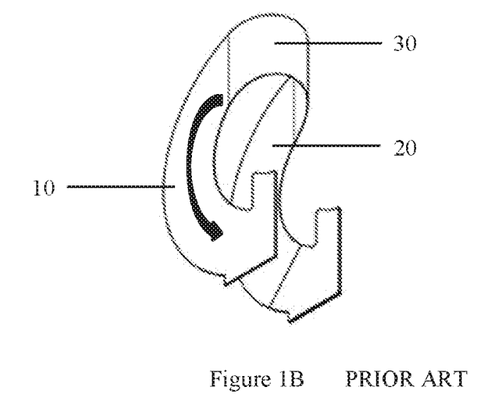
FIG. 1B illustrates a perspective view of the conventional FPC board after bending.
Figure 1C:
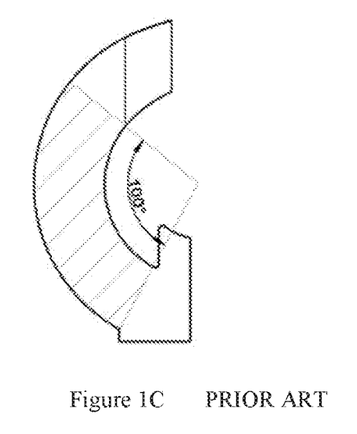
FIG. 1C illustrates a side view of the conventional FPC board after bending.

One common solution is to use flexible printed circuit (FPC) boards inside the robot joints to transmit power and various signals. FIG. 1A shows the expanded view of a normal FPC board in a shape of a broken ring. FIG. 1B shows perspective view of the FPC board after bending. As shown in FIG. 1B, the FPC board is bent at a bending portion 30 to from a first portion 10 and a second portion 20. The first portion 10 is rotatable with respect to the second portion 20 around a rotation axis of the robot joint. Theoretically, the two portions 10 and 20 have an overlapping area of no larger than 180 degrees around the rotation centre, which means the rotation range of the FPC board is smaller than ±360 degrees. Actually, considering the bending radius and other factors, the overlapping area can only cover about 100 degrees as shown in FIG. 1C. Therefore, the rotation range of the FPC board is smaller than ±200 degrees, which is not even close to the ideal rotation range of ±360 degrees.

SUMMARY OF INVENTION

One of the objectives of the present invention is to propose a robot joint which is compact, enables a large rotation range and has a long lifetime.

According to one aspect of the present invention, there is provided a robot joint comprising: a first part and a second part configured to be rotatable with each other around a joint axis; and a flexible printed circuit board including a first fixing point and a second fixing point respectively fastened to the first part and the second part; wherein: the flexible printed circuit board prior to bending is spiral-shaped; and with the relative rotation of the first part and the second part, the flexible printed circuit board is bent at various bending portions.

The present disclosure is advantageous that it provides a compact robot joint with larger rotation range and long lifetime in a cost effective way.

BRIEF DESCRIPTION OF DRAWINGS

The subject matter of the invention will be explained in more detail in the following text with reference to preferred exemplary embodiments which are illustrated in the drawings, in which.

PREFERRED EMBODIMENTS OF THE INVENTION

Reference will now be made in detail to several embodiments of the present invention, example of which are illustrated in the accompanying figures. It is noted that wherever practicable similar or like reference numbers may be used in the figures, and may indicates similar or like functionality. The figures depict embodiments of the present invention for purposes of illustration only. One skilled in the art will readily recognize from the following description that alternative embodiments of the structures and methods illustrated herein may be employed without departing from the principles of the present invention described therein.

A flexible printed circuit (FPC) board typically refers to a circuit or wiring structure mounted on a flexible plastic substrate, such as polyimide or polyester film. A type of FPC board contains one or more printed wires for interconnecting electronic components or electronic assemblies either directly or by means of connectors. An FPC board can be as thin as 0.1 mm and can be bent with a bending radius of as small as 1 mm.

Figure 2A:
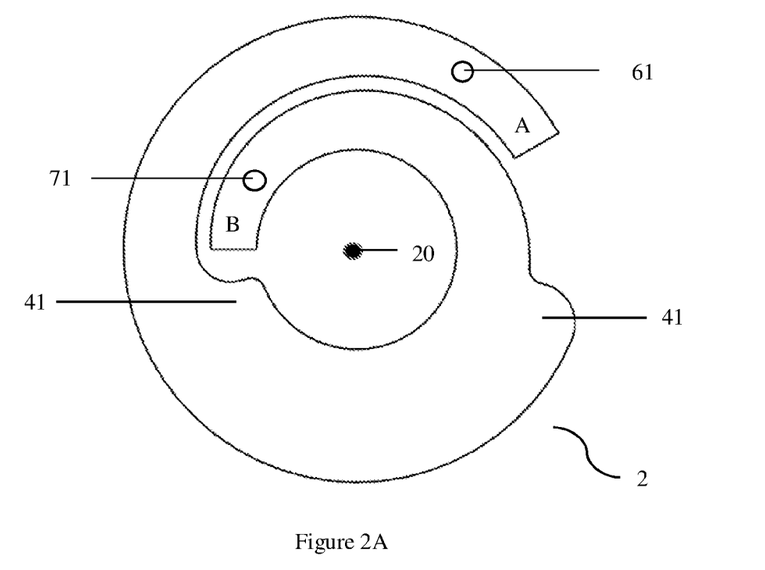
FIG. 2A illustrates an FPC board according to an embodiment of present invention.

FIG. 2A illustrates an FPC board according to an embodiment of present invention. As shown in FIG. 2A, an FPC board 2 is in a shape of a spiral. The spiral-shaped FPC board 2 winds around its center point 20 by more than 360 degrees prior to the bending. A first terminal A, which is arranged at one end of the spiral-shaped FPC board 2, can be used as an input or output for signals or power; while a second terminal B, which is arranged at the other end of the spiral-shaped FPC board 2, can be used as an input or output for signals or power too. In a shape of spiral, the curve portion of the FPC board 2 is arranged in that it emanates from the center point 20, getting progressively farther away as it revolves around the center point 20. The first terminal A is arranged farther than the second terminal B from the center point 20. On the FPC board 2, there are arranged a first fixing point 61 and a second fixing point 71, which may be arranged close to the first terminal A and the second terminal B respectively. The spiral-shaped FPC board 2 winds around its center point from the first fixing point 61 to the second fixing point 71 by more than 360 degrees prior to bending. The FPC board 2 further comprises at least one extension portion 41, which either radially extend toward or away from a part of the spiral-shaped FPC board 2 with respective to the center point 20, and such part is placed between the first fixing point 61 and the second fixing point 71 along the curve portion of the spiral-shaped FPC board 2. The extension portion 41 extending from the curve portion of the FPC boards 2 is arranged to keep clear of the other curve portion, for instance the other curve portion adjacent to the curve portion. For example the curve length between the first fixing 61 and the second fixing point 71 accounts for ⅓ of the curve length of the FPC board 2.

Figure 2B:
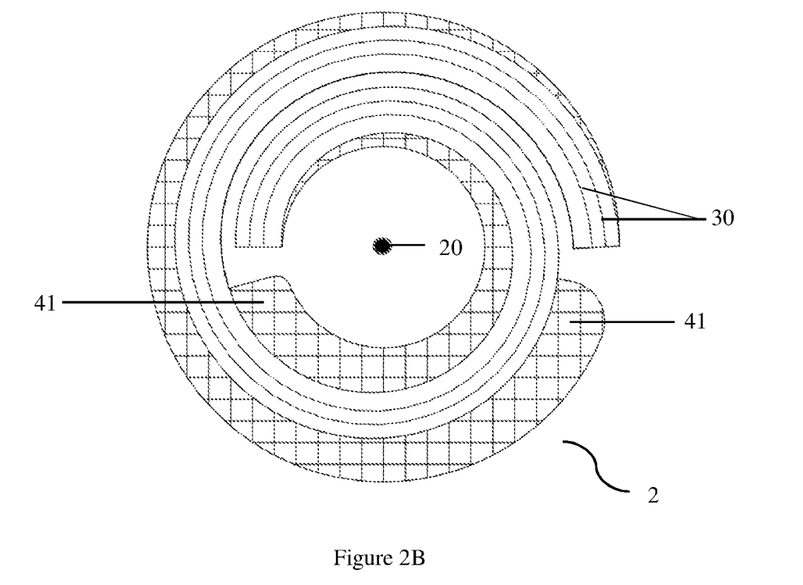
FIG. 2B illustrates component structure of the FPC board according to FIG. 2A.

FIG. 2B illustrates component structure of the FPC board according to FIG. 2A. As shown in FIG. 2B, the FPC board 2 contains a plurality of printed wires 30 each in a shape of a spiral, which are wired in parallel and emanate from the center point 20 electrically connecting the first terminal A and the second terminal B of the FPC board 2. The extension portions 41, as indicated by cross mark, are arranged along the inner curve portion and/or outer curve portion of the spiral-shaped FPC board 2. The extension portions 41 can be designed as arc shape extending toward or away from the center point 20 of the spiral-shaped FPC board 2, in order to enlarge the width of the inner curve portion and/or outer curve portion. These extension portions 41 can be made of polyimide film or other flexible plastic substrate having characteristics of mechanical balance of any distortion effected from the bending of the FPC board 2.

Figure 2C:
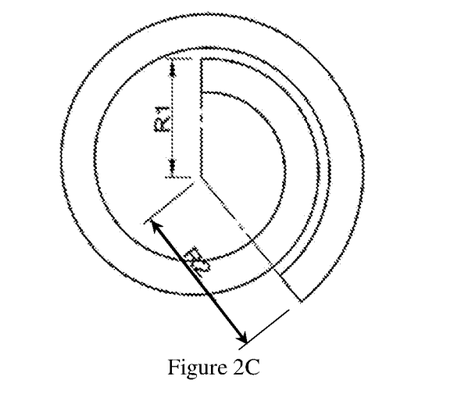
FIGS. 2C and 2D respectively illustrate alternative embodiments of a FPC board according to present invention.
Figure 2D:
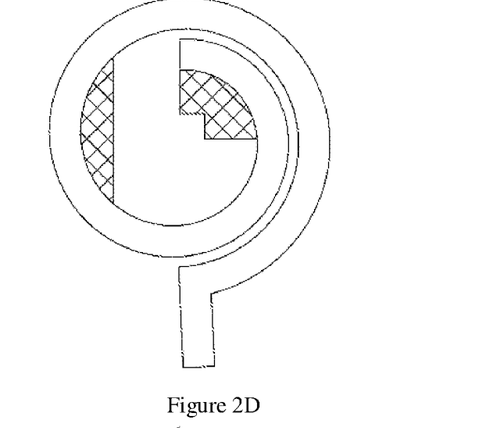

As shown in FIGS. 2C and 2D, the FPC board may alternatively be in a shape of a spiral without extension portion, or in a shape of a spiral with step-shaped through hole. In FIG. 2D, the extension portions are marked with cross. The radius of the inner curve R1 is smaller than the radius of the outer curve R2.

As shown in FIGS. 2A through 2D, a hole structure is provided at the center of the FPC board to allow other components such as shaft, hose, etc. to pass through. The hole structure may be of any appropriate shape, as long as it provides enough space for the shaft.

Figure 3:
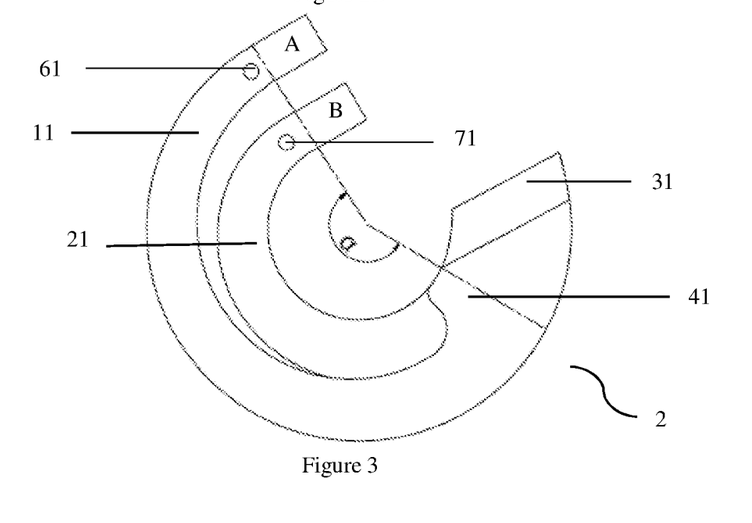
FIG. 3 illustrates a perspective view of a FPC board after bending according to FIG. 2A.

FIG. 3 illustrates a perspective view of a FPC board after bending according to FIG. 2A. As shown in FIG. 3, the FPC board 2 is bent at a bending portion 31 separating the FPC board 2 into a first portion 11 laid in a first plane and a second portion 21 laid in a second plane. The bending portion 31 occurs between the first portion 11 and the second portion 21, which achieves a compact routing structure. The first portion 11 and the second portion 21 are smoothly divided by the bending portion 31. With the relative rotation of the first fixing point 61 and the second fixing point 71 of the FPC board 2 around a rotation axis substantially perpendicular to the first plane and the second plane, the FPC board 2 is bent at various bending portions 31. The spiral-shaped FPC board 2 winds around its center point 20 from the first fixing point 61 to the second fixing point 71 by more than 360 degrees prior to bending, thus when bending at various bending portions 31, the first portion 11 and the second portion 21 are partially concentric with a concentric angle α of larger than 180 degrees, which eventually determines the rotation range of the robot joint of larger than ±360 degrees. Since the curve portion of the spiral-shaped FPC board 2 gradually deviates from the center point 20 from the first fixing point 61 to the second fixing pint 71, the first portion 11 and the second portion 21 of the FPC board 2 have an overlapping area from a perspective substantially parallel to the first plane and the second plane. The overlapping area renders the first portion 11 and the second portion 21 opposed to each other so as to prevent the first portion 11 and the second portion 21 from twisting together, for example due to the internal stress of the FPC board, gravity, etc. . . . . The overlapping area can be expanded by using the extension portion 41, which in turn further strengthens the technical effect of twisting-prevention.

Figure 4A:
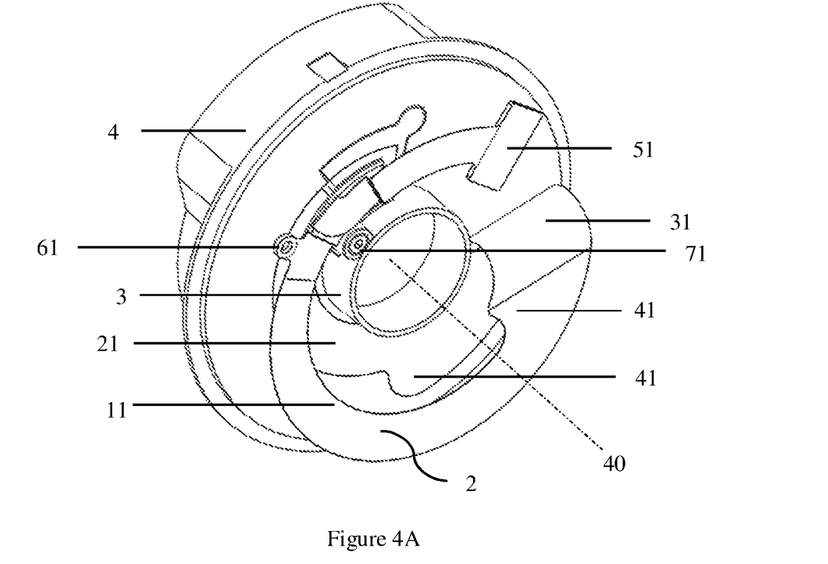
FIG. 4A is a state diagram of a robot joint with a FPC board according to FIG. 2 in the initial position.
Figure 6:
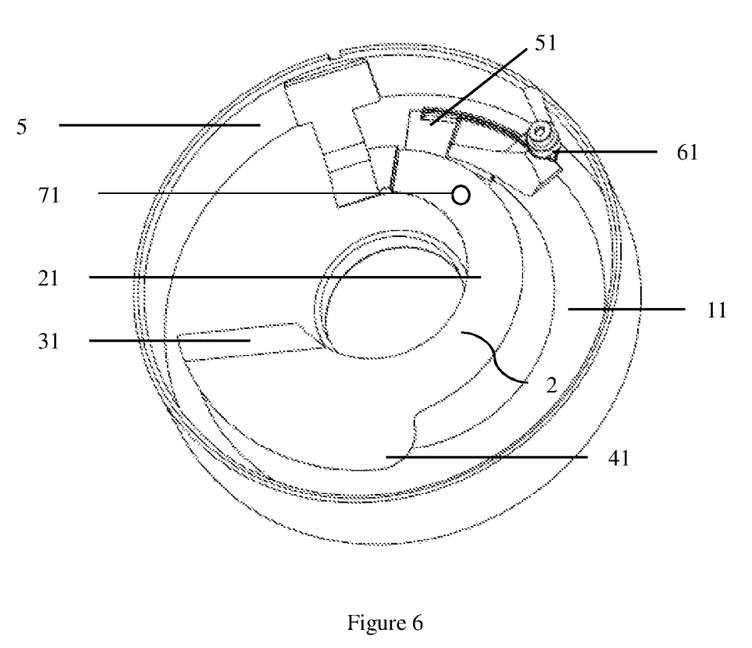
FIG. 6 illustrates a view from a perspective of looking at the internal of second part 5 of the robot joint according to FIG. 4A.

FIG. 4A is a state diagram of a robot joint with a FPC board according to FIG. 2 in the initial position. FIG. 6 illustrates a view from a perspective of looking at the internal of second part 5 of the robot joint according to FIG. 4A. As shown in FIGS. 4A and 6, a robot joint comprises a first part 4 and a second part 5, configured to be rotatable with each other around a joint axis 40. The first part 4 is connected to the FPC board 2 by its fixing point 71 at any locations on the first part 4, and the second part 5 is connected to the FPC board 2 by its fixing point 61 at any locations on the second part 5. With the relative rotation of the first part 4 and the second part 5 which causes the relative rotation of the first fixing point 71 and the second fixing point 61 on the FPC board 2, the FPC board 2 is bent at various bending portions 31. The fixing points 61 and 71 at the PFC board may be arranged close to each end of the PFC board 2 respectively, so as to get a larger rotation range. The robot joint further includes a shaft 3 arranged along the joint axis 40, the first part 4 and the shaft 3 are rotatable with each other and the second part 5 is fixed with the shaft 3. In particular, the shaft 3 is arranged to stick through the first part 4 and have the second part 5 fastened to one of its end. Thus, a rotation of the shaft 3 can drive the second part 5 to rotate, and both of them can rotate with respective to the first part 4. The extension portion 41 arranged along the inner cure portion of the FPC board 2 can be adapted to fit the outer surface of a shaft 3, and the extension portion 41 arranged along the outer curve portion of the FPC board 2 can be adapted to fit the inner surface of the first part 4 and/or the second part 5. The output side of the FPC board 2 is connected to at least one output cable 7 by a tab 51.

Figure 4B:
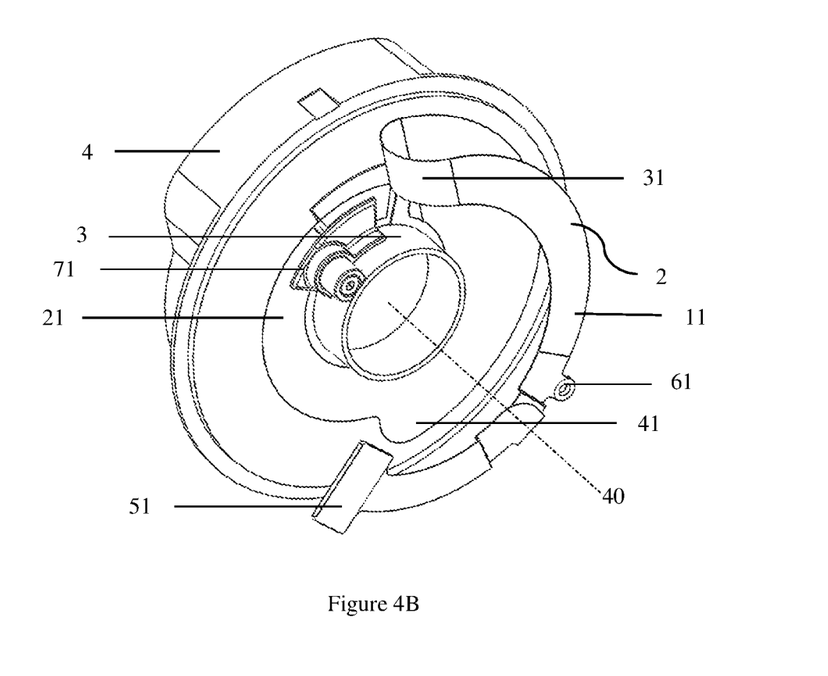
FIGS. 4B and 4C respectively illustrate the state diagrams of the FPC board which has been rotated counterclockwise according to FIG. 2.
Figure 4C:
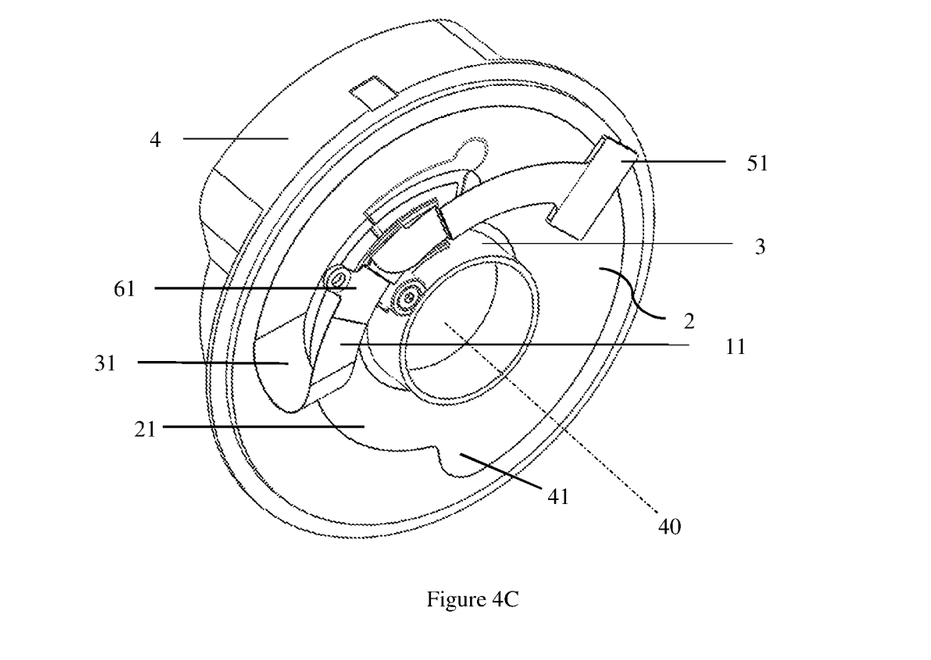
Figure 4D:
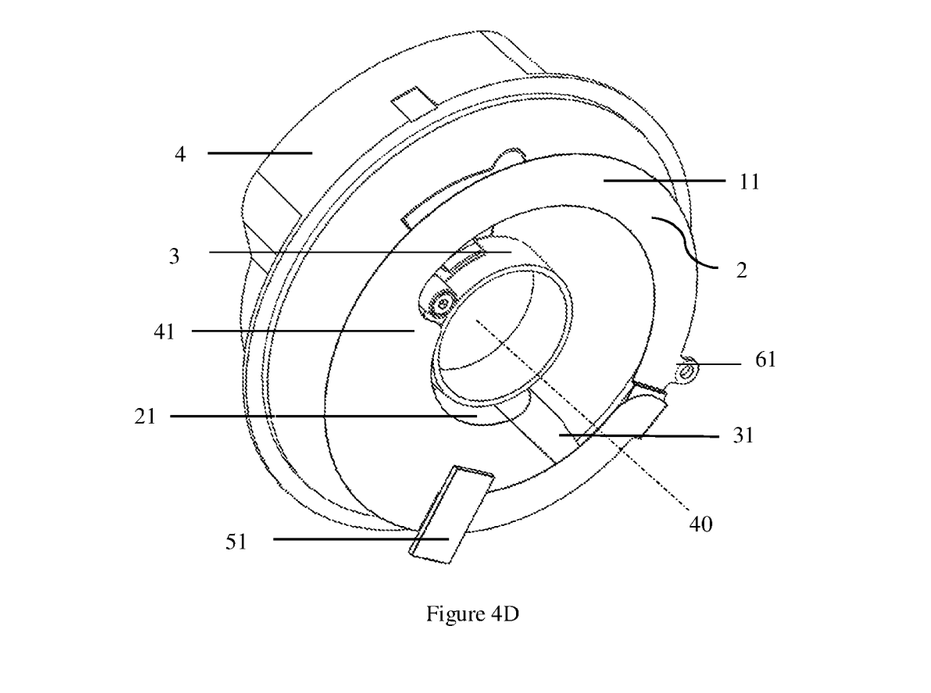
FIGS. 4D and 4E respectively illustrate the state diagrams of the FPC board which has been rotated clockwise according to FIG. 2.
Figure 4E:
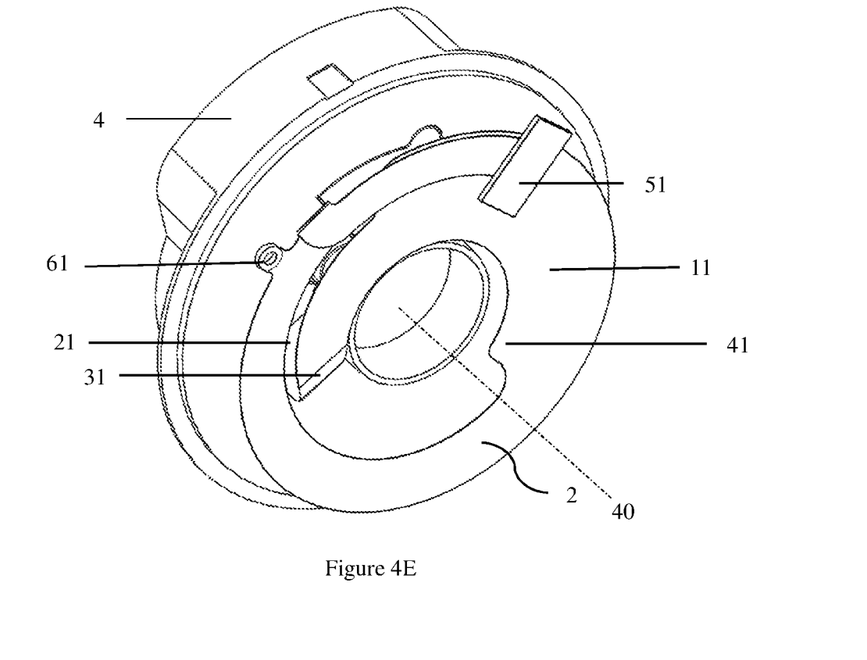

As the second part 5 rotates with respective to the first part 4, the second part 5 drives the second fixing point 61 of the FPC board 2 to rotate with respect to the first fixing point 71 of the FPC board 2 around a rotation axis substantially perpendicular to at least one of the first plane and the second plane. The rotation axis can be in alignment with the robot joint axis 40. During operation, the extension portions 41 can balance the distortion of the bending FPC board 2, so that the FPC board 2 may continuously contact with the first part 4 (as shown in FIGS. 4B, 4C), the second part 5 (as shown in FIGS. 4D, 4E) and both of them (as shown in FIG. 4A) to make sure the first portion 11 rotates without unnecessary twisting and/or sliding with respect to the second portion 21. On the other hand, the extension portions 41 may further prevent the upper portion (e.g. the first portion 11) of the FPC board falling on the lower portion (e.g. the second portion 21) of the PFC board and crossing with together due to the internal stress of the FPC board, gravity, etc. With this development, the interference of the FPC board itself will be reduced, therefore the lifetime of the robot joint will be increased.

As shown in FIGS. 4B and 4C, the FPC board has been rotated counter clockwise by 180 degrees and 360 degrees respectively from the initial position shown in FIG. 4A. As the first fixing point 61 rotates with respect to the second fixing point 71, the bending portion 31 shifts along the FPC board, and the lengths of the first and second portions 11 and 21 change correspondingly. At the same time, the position of the bending portion 31 in space rotates correspondingly. In the case of FIGS. 4B and 4C, the length of the first portion 11 has become significantly smaller than the length of the second portion 21.

As shown in FIGS. 4D and 4E, the FPC board has been rotated clockwise by 180 degrees and 360 degrees respectively from the initial position shown in FIG. 4A. In the case of FIGS. 4D and 4E, the length of the first portion 11 has become significantly larger than the length of the second portion 21.

The clockwise rotation and counter clockwise rotation are both allowed to be larger than 360 degrees. Therefore the rotation range of the robot joint is larger than ±360 degrees. However, it should be noted that the FPC board can be bent at two or more bending portions, in that case the rotation range of the FPC board can be larger than ±720 degrees.

In an embodiment of the present invention, the robot joint may comprise two or more FPC boards stacked together and bent together with the FPC boards as described above. In other words, the FPC boards are arranged on top of one another to form a layered structure and are bent at one or more common bending portions. During operation, the FPC boards move together in the same manner as a single FPC board. One of the advantages of providing two or more stacked FPC boards is increasing signal transmitting capacity without increasing the size of the robot joint.

Figure 5:
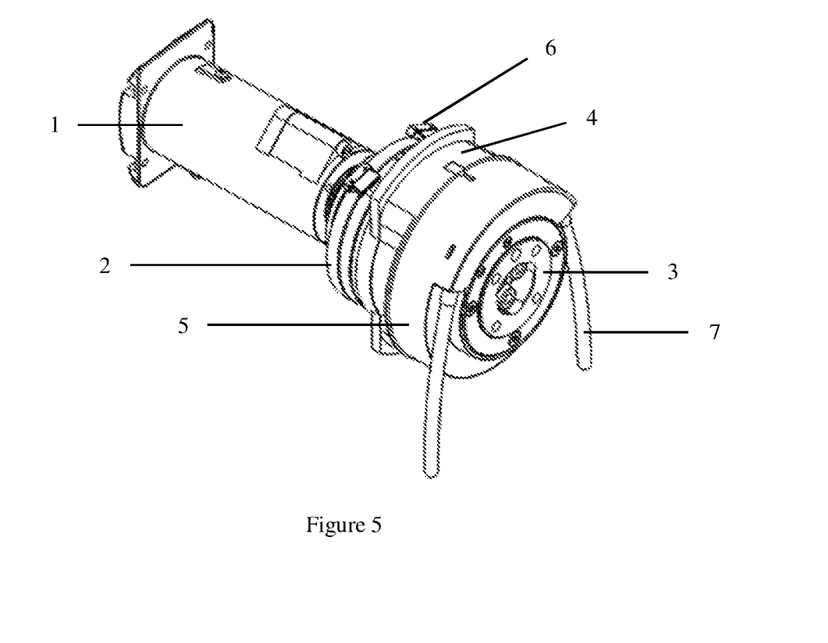
FIG. 5 illustrates a schematic diagram of a rotary joint according to an embodiment of present invention.

FIG. 5 illustrates a schematic diagram of a robot joint. As shown in FIG. 5, the robot joint includes a motor 1 driving a gear 2 to rotate, and further driving a shaft 3 to rotate. The robot joint also includes a first part 4 which is stationary with respect to the motor 1 and a second part 5 which is rotatable with the shaft 3. At least one input cable 6 and at least one output cable 7 are connected to the first part 4 and the second part 5 respectively. The gear 2 and the shaft 3 can be structured to have a through hole at the center to allow other components such as hose to pass through. At least one FPC board is arranged at the internal space between the first part 4 and the second part 5, and rotatable along the shaft 3 with a rotation range of larger than ±360 degrees. As described above, the robot joint is compact, enables a large rotation range and has a long lifetime.

The robot joint according to the embodiments of present invention can be used in a robot.

Though the present invention has been described on the basis of some preferred embodiments, those skilled in the art should appreciate that those embodiments should by no way limit the scope of the present invention. Without departing from the spirit and concept of the present invention, any variations and modifications to the embodiments should be within the apprehension of those with ordinary knowledge and skills in the art, and therefore fall in the scope of the present invention which is defined by the accompanied claims.

The invention claimed is:

1. A robot joint, comprising:
a first part and a second part configured to be rotatable with each other around a joint axis; and
a flexible printed circuit board including a first fixing point and a second fixing point respectively fastened to the first part and the second part, the flexible printed circuit board comprising an extension portion arranged to radially extend from a curve portion of the flexible printed circuit board between the first fixing point and the second fixing point prior to the bending, the extension portion being in the shape of arc and arranged to extend toward or away from a center point of the printed circuit board prior to the bending;
wherein:
the flexible printed circuit board prior to bending is spiral-shaped; and
with the relative rotation of the first part and the second part, the flexible printed circuit board is bent at various bending portions.

2. The robot joint according to claim 1, wherein:
the spiral-shaped flexible printed circuit board winds around its center point from the first fixing point to the second fixing point by more than 360 degrees prior to the bending.

3. The robot joint according to claim 2, wherein:
the bending portion occurs between a first portion and a second portion of the flexible printed circuit board.

4. The robot joint according to claim 3, wherein:
the first portion and the second portion of the flexible printed circuit board have an overlapping area.

5. The robot joint according to claim 4, further comprising:
a shaft;
wherein:
the shaft is arranged along the joint axis;
the first part and the shaft are rotatable with each other;
the second part is fixed with respect to the shaft; and
the printed circuit board is arranged at the internal space between the first part and the second part.

6. The robot joint according to claim 5, further comprising:
a motor and a gear;
wherein the motor drives the gear to rotate, and further drives the shaft to rotate;
wherein the extension portion of the printed circuit board is adapted to fit the outer surface of the shaft.

7. The robot joint according to claim 5, further comprising:
a motor and a gear;
wherein the motor drives the gear to rotate, and further drives the shaft to rotate;
wherein the extension portion of the printed circuit board is adapted to fit the inner surface of the first part and/or the second part.

8. The robot joint further comprising:
one or more further flexible printed circuit boards stacked and bent together with the flexible printed circuit board according to claim 7.

9. The robot joint according to claim 1, wherein:
the bending portion occurs between a first portion and a second portion of the flexible printed circuit board.

10. The robot joint according to claim 9, wherein:
the first portion and the second portion of the flexible printed circuit board have an overlapping area.

11. The robot joint according to claim 1, further comprising:
a shaft;
wherein:
the shaft is arranged along the joint axis;
the first part and the shaft are rotatable with each other;
the second part is fixed with respect to the shaft; and
the printed circuit board is arranged at the internal space between the first part and the second part.

12. The robot joint according to claim 11, wherein:
the extension portion of the printed circuit board is adapted to fit the outer surface of the shaft.

13. The robot joint according to claim 11, wherein:
the extension portion of the printed circuit board is adapted to fit the inner surface of the first part and/or the second part.

14. The robot joint according to claim 13, further comprising:
a motor and a gear; wherein
the motor drives the gear to rotate, and further drives the shaft to rotate.

15. The robot joint further comprising:
one or more further flexible printed circuit boards stacked and bent together with the flexible printed circuit board according to claim 1.

16. A robot, comprising a robot joint according to claim 1.

17. The robot joint according to claim 1, wherein:
the extension portion is arranged to extend toward the center point of the printed circuit board prior to the bending.

18. The robot joint according to claim 1, wherein:
the extension portion is arranged to extend away from the center point of the printed circuit board prior to the bending.

19. The robot joint according to claim 1, wherein:
the extension portion is arranged to extend toward and away from the center point of the printed circuit board prior to the bending.

20. A robot, comprising a robot joint according to claim 19.

* * * * *